(12) United States Patent
Kang et al.

(10) Patent No.: US 8,207,741 B2
(45) Date of Patent: Jun. 26, 2012

(54) APPARATUS AND METHOD FOR SENSING LEAKAGE CURRENT OF BATTERY, AND BATTERY-DRIVEN APPARATUS AND BATTERY PACK COMPRISING THE APPARATUS

(75) Inventors: Ju-Hyun Kang, Daejeon (KR); Dal-Hoon Lee, Daejeon (KR); Jee-Ho Kim, Daejeon (KR); Sang-Hoon Lee, Daejeon (KR); Dong-Keun Kwon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 356 days.

(21) Appl. No.: 12/696,656

(22) Filed: Jan. 29, 2010

(65) Prior Publication Data
US 2010/0156426 A1 Jun. 24, 2010

Related U.S. Application Data

(63) Continuation of application No. PCT/KR2009/004448, filed on Aug. 10, 2009.

(30) Foreign Application Priority Data

Aug. 11, 2008 (KR) ......................... 10-2008-0078499

(51) Int. Cl.
*G01N 27/416* (2006.01)
(52) U.S. Cl. ....................................... 324/433
(58) Field of Classification Search .................. None
See application file for complete search history.

(56) References Cited

U.S. PATENT DOCUMENTS
8,058,847 B2 * 11/2011 Jaeger et al. .................. 320/134

FOREIGN PATENT DOCUMENTS
| JP | 7-203601 A | 8/1995 |
| JP | 2004-6190 A | 1/2004 |
| JP | 2007-198877 A | 8/2007 |

* cited by examiner

*Primary Examiner* — Roberto Velez
(74) *Attorney, Agent, or Firm* — Birch, Stewart, Kolasch & Birch, LLP

(57) ABSTRACT

An apparatus for sensing a leakage current of a battery comprises a floating capacitor charged with a voltage detected from a cathode or anode terminal of a battery; a terminal selection switching unit for selecting a voltage detection path for the cathode or anode terminal; a charge switching unit for charging the floating capacitor with a detection voltage of the cathode or anode terminal, detected through the selected voltage detection path; a polarity reverse switching unit for reversing a polarity of the detection voltage of the anode terminal charged to the floating capacitor; and a leakage current determining unit for sensing the detection voltage of the cathode terminal charged to the floating capacitor and the polarity-reversed detection voltage of the anode terminal charged to the floating capacitor to calculate a leakage resistance, and comparing the calculated leakage resistance with a criterion insulation resistance to determine whether a leakage current occurs.

16 Claims, 3 Drawing Sheets

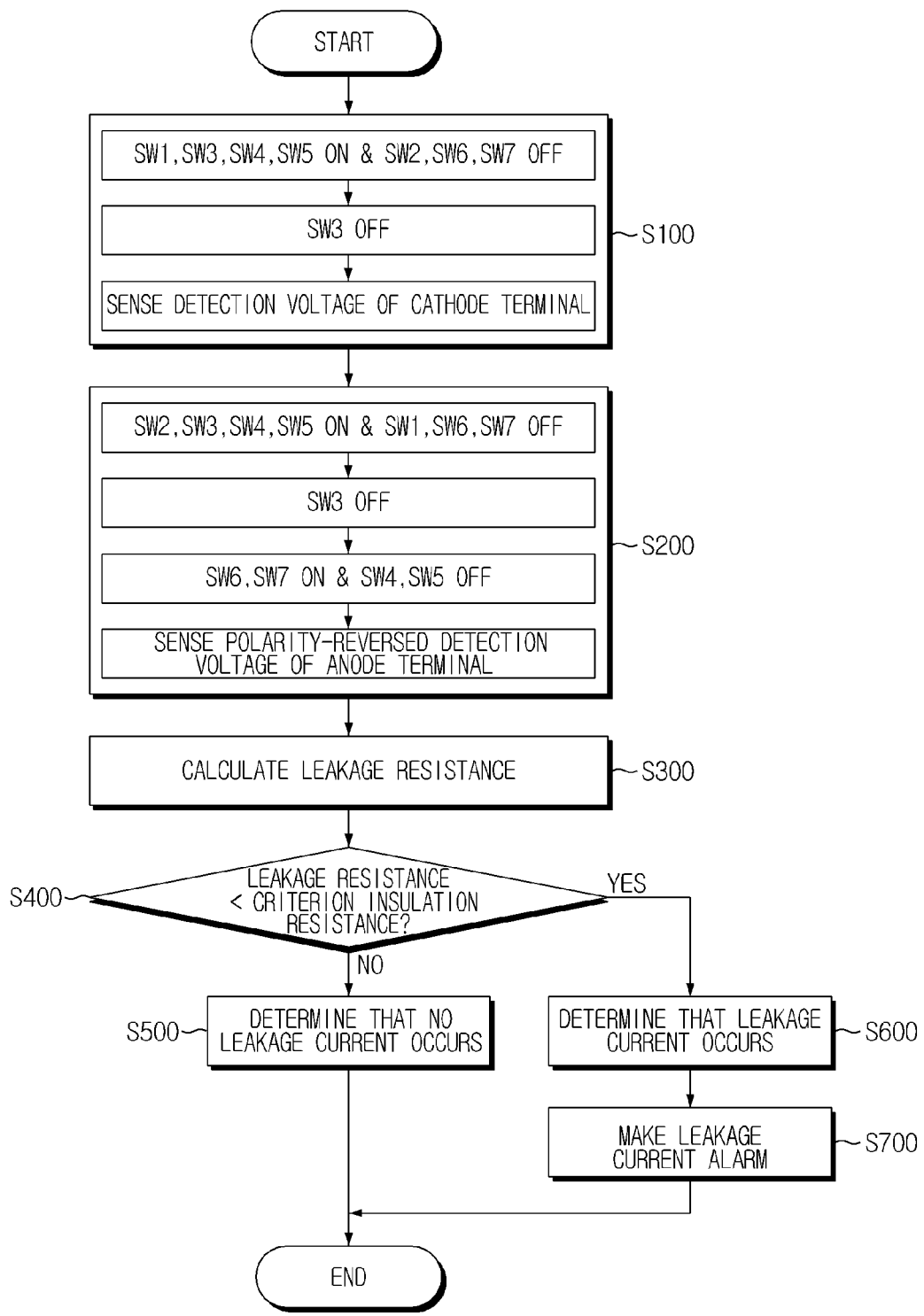

APPARATUS AND METHOD FOR SENSING LEAKAGE CURRENT OF BATTERY, AND BATTERY-DRIVEN APPARATUS AND BATTERY PACK COMPRISING THE APPARATUS

CROSS REFERENCE TO RELATED APPLICATIONS

The present application is a continuation of National Phase Application No. PCT/KR2009/004448 filed on Aug. 10, 2009, which claims priority under 35 U.S.C. 119(a) to patent application No. 10-2008-0078499, filed in Republic of Korea on Aug. 11, 2008, all of which are hereby expressly incorporated by reference into the present application.

TECHNICAL FIELD

The present invention relates to battery management apparatus and method, and more particularly to apparatus and method for sensing leakage current of a battery.

BACKGROUND ART

In recent, along with exhaustion of fossil fuels and environmental contamination, more interests are taken in electric vehicles or hybrid vehicles, which may be driven by means of batteries without using fossil fuels (hereinafter, generally called electric vehicles).

Batteries used for electric vehicles are mostly secondary batteries. Secondary batteries are classified into lithium series batteries and nickel-hydrogen series batteries. Lithium series batteries are mainly applied to small products such as digital cameras, P-DVD, MP3P, cellular phones, PDA, portable game devices, power tools and E-bikes, and nickel-hydrogen series are mainly applied to products demanding high output such as vehicles.

Any device using a battery needs to keep an insulation between the battery and the device in a good state. Bad insulation of the battery causes a leakage current, which results in various problems.

For reference, a leakage current of a battery causes unexpected discharge of the battery or malfunctions of electronic equipment provided at the device. Also, a leakage current of a battery employed in a device using a high voltage battery may give a fatal electric shock to a person.

Accordingly, in the related art, it is demanded to develop a scheme for thoroughly monitoring a leakage current of a battery.

DISCLOSURE

Technical Problem

The present invention is designed to solve the problems of the conventional field, and therefore it is an aspect of the present invention to provide apparatus and method for sensing a leakage current of a battery, which may sense a leakage current of a battery using a simple circuit configuration in an easy and accurate way. Another aspect of the present invention is to provide a battery-driven apparatus and a battery pack comprising such a sensing apparatus.

Technical Solution

The present invention provides an apparatus for sensing a leakage current of a battery, which comprises a floating capacitor charged with a voltage detected from a cathode terminal or an anode terminal of a battery; a terminal selection switching unit for selecting a voltage detection path for the cathode or anode terminal; a charge switching unit for charging the floating capacitor with a detection voltage of the cathode or anode terminal, detected through the selected voltage detection path; a polarity reverse switching unit for reversing a polarity of the detection voltage of the anode terminal charged to the floating capacitor; and a leakage current determining unit for sensing the detection voltage of the cathode terminal charged to the floating capacitor and the polarity-reversed detection voltage of the anode terminal charged to the floating capacitor to calculate a leakage resistance, and then comparing the calculated leakage resistance with a criterion insulation resistance to determine whether or not a leakage current occurs.

The apparatus for sensing a leakage current of a battery according to the present invention may further comprise a voltage distribution node installed on a first line formed between the cathode and anode terminals of the battery.

In the present invention, the terminal selection switching unit may comprise a first switch and a second switch respectively installed between the voltage distribution node and the cathode terminal of the battery and between the voltage distribution node and the anode terminal of the battery; and a third switch installed on a second line extending from the voltage distribution node.

Preferably, the floating capacitor may be installed on a third line arranged in parallel with the second line.

Preferably, the charge switching unit may comprise a fourth switch for switching the connection between a first terminal of the floating capacitor and the selected voltage detection path; and a fifth switch for switching the connection between a second terminal of the floating capacitor and the ground.

Preferably, the polarity reverse switching unit may comprise a sixth switch for switching the connection between a first terminal of the floating capacitor and the ground; and a seventh switch for switching the connection between a second terminal of the floating capacitor and the selected voltage detection path.

According to the present invention, the leakage current determining unit may comprise a switch controller for controlling operations of the terminal selection switching unit, the charge switching unit and the polarity reverse switching unit; a voltage detection unit for sensing the detection voltage of the cathode terminal and the polarity-reversed detection voltage of the anode terminal output from the floating capacitor and then outputting an analog voltage signal corresponding thereto; an A/D (Analog/Digital) converter for converting the output analog voltage signal into a digital voltage signal; and a CPU (Central Processing Unit) for calculating a leakage resistance using the digital voltage signal received from the A/D converter and then comparing the leakage resistance with the criterion insulation resistance to determine whether or not a leakage current occurs.

Preferably, the voltage detection unit may comprise a differential amplifier for sensing the detection voltage of the cathode terminal applied from the floating capacitor and the polarity-reversed detection voltage of the anode terminal applied from the floating capacitor.

According to the present invention, the leakage current determining unit may calculate a leakage resistance according to the following equation:

$$R_{leakage} = R_i \times \frac{(E - V_A + V_B)}{(V_A - V_B)}$$

where $R_i$ is an internal resistance of the apparatus, E is a voltage of both ends of the battery, $V_A$ is the detection voltage of the cathode terminal charged to the floating capacitor, and $V_B$ is the polarity-reversed detection voltage of the anode terminal charged to the floating capacitor.

Selectively, the leakage current determining unit may comprise a leakage current alarming unit for giving a visual or audible alarm when a leakage current occurs. In this case, the leakage current determining unit may make a visible or audible alarm through the leakage current alarming unit when a leakage current occurs.

Preferably, the leakage current determining unit may determine that a leakage current occurs on the condition that the calculated leakage resistance is smaller than a criterion insulation resistance.

In another aspect of the present invention, there is also provided a battery-driven apparatus or a battery pack, which comprises the apparatus for sensing a leakage current of a battery, explained above.

In further aspect of the present invention, there is also provided a method for sensing a leakage current of a battery, which comprises charging a floating capacitor with a detection voltage of a cathode terminal of a battery by selecting a voltage detection path for the cathode terminal of the battery, and then sensing the charged detection voltage of the cathode terminal; charging the floating capacitor with a detection voltage of an anode terminal of the battery by selecting a voltage detection path for the anode terminal of the battery, and then reversing a polarity of the charged detection voltage of the anode terminal and sensing the polarity-reversed detection voltage of the anode terminal; calculating a leakage resistance by using the sensed detection voltage of the cathode terminal and the polarity-reversed detection voltage of the anode terminal; and comparing the calculated leakage resistance with a criterion insulation resistance to determine whether or not a leakage current occurs.

Advantageous Effects

In one aspect of the present invention, a leakage current of a battery is sensed using a simple leakage current sensing circuit comprising a floating capacitor, so it is possible to sense the occurrence of a leakage current of a battery at an early stage and then prevent the battery from being fully discharged. Also, it is possible to take protective measures against malfunctions or breakdown of internal parts of a vehicle, caused by a leakage current, and also to prevent injury of humans caused by a leakage current of a battery.

In another aspect of the present invention, the floating capacitor is electrically separated from the battery before sensing a voltage charged to the floating capacitor, so it is possible to decrease noise introduced from the battery, which allows more accurate detection of a leakage current.

In still another aspect of the present invention, the polarity of a detection voltage of an anode terminal of the battery, charged to the floating capacitor, is reversed using a polarity reverse switching unit, so a detection voltage with the same polarity is applied to the voltage detection unit. As a result, the circuit configuration of the voltage detection unit may be simplified.

DESCRIPTION OF DRAWINGS

The accompanying drawings illustrate the preferred embodiments of the present invention and are included to provide a further understanding of the spirit of the present invention together with the detailed description of the invention, and accordingly, the present invention should not be limitedly interpreted to only the matters shown in the drawings.

FIG. 3 is a flowchart illustrating a method for sensing a leakage current of a battery according to a preferred embodiment of the present invention.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
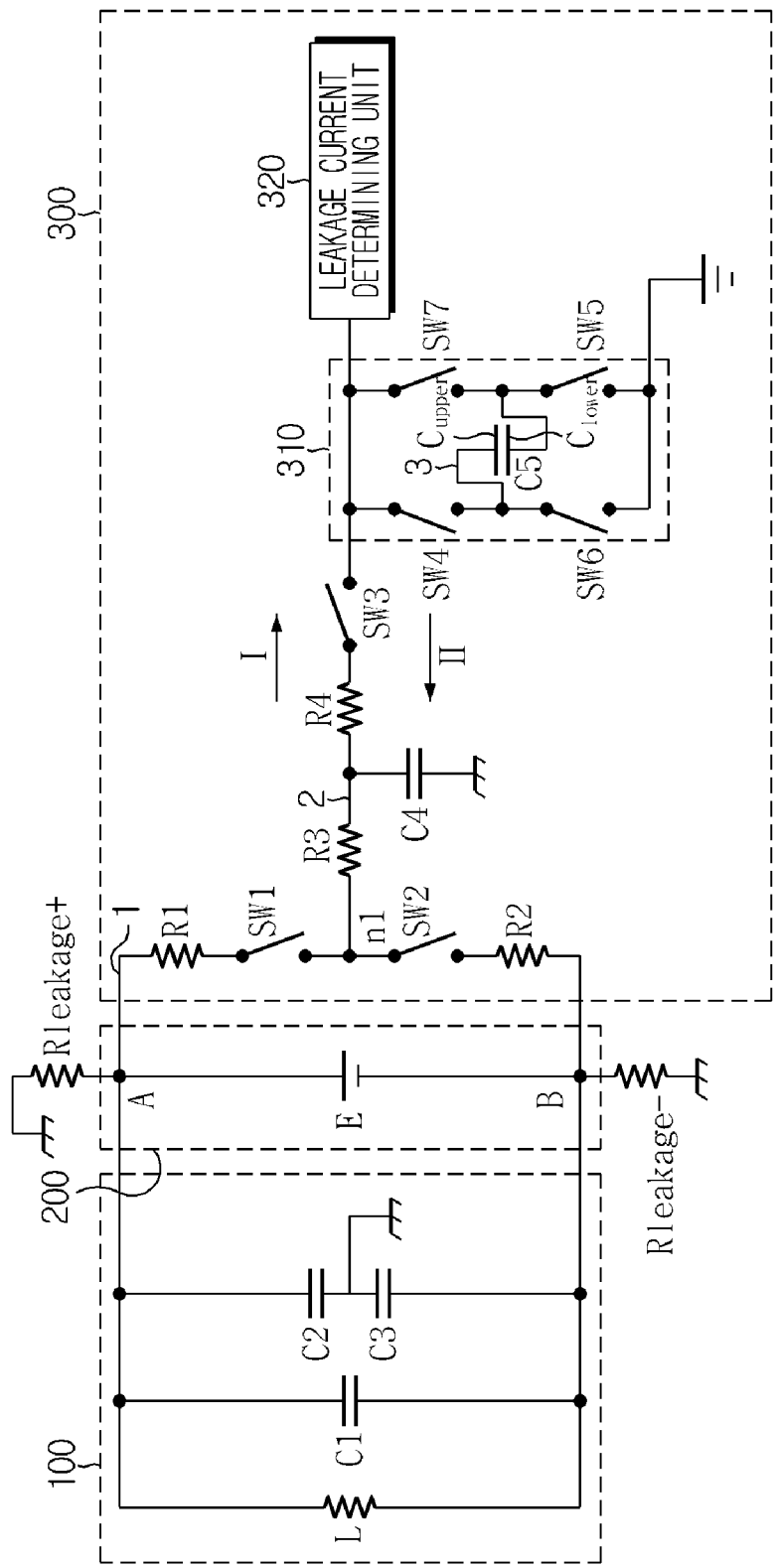
FIG. 1 is a circuit diagram showing an apparatus for sensing a leakage current of a battery according to a preferred embodiment of the present invention.

FIG. 1 is a circuit diagram showing an apparatus for sensing a leakage current of a battery according to a preferred embodiment of the present invention.

As shown in FIG. 1, a battery leakage current sensing apparatus 300 according to the present invention is connected to both terminals of a battery 200 having a plurality of cells and supplying power to a load system 100, so as to sense a leakage current of the battery 200.

In this embodiment, the load system 100 is a means using the electric energy output from the battery 200, and it may be a system demanding high power such as an electric vehicle or a hybrid vehicle. A load L of the load system 100, which consumes electric energy, may be a driving motor for transmitting power to an electric vehicle or a hybrid vehicle, a DC-to-DC converter for converting a voltage level output from the battery 200, or the like. However, the load system 100 of the present invention and the load L comprised therein are not limited to the above. In FIG. 1, a capacitor C1 is a filter for filtering noise generated from the load system 100, and capacitors C2 and C3 are inherently present between the battery 200 and the load L when the battery 200 is connected to the load L.

The battery 200 is a means storing electric energy, and the battery 200 comprises a plurality of rechargeable unit cells connected in series or in parallel. The unit cell is an electric double-layer capacitor or a secondary battery such as a lithium ion battery, a lithium polymer battery, a nickel cadmium battery, a nickel hydrogen battery and a nickel zinc battery, well known in the art.

The battery leakage current sensing apparatus 300 according to the present invention comprises a floating capacitor C5 charged with a voltage detected from a cathode terminal A or an anode terminal B of a battery, a terminal selection switching unit SW1, SW2, SW3 for selecting a voltage detection path in the direction of the cathode terminal A or the anode terminal B, a charge switching unit SW4, SW5 for charging the floating capacitor C5 with the detection voltage of the cathode terminal A or the anode terminal B detected through the selected voltage detection path, a polarity reverse switching unit SW6, SW7 for reversing polarity of the detection voltage of the anode terminal B charged to the floating capacitor C5, and a leakage current determining unit 320 for sensing the detection voltage of the cathode terminal A charged to the floating capacitor C5 and the polarity-reversed detection voltage of the anode terminal B charged to the floating capacitor C5 to calculate a leakage resistance and then comparing the leakage resistance with a criterion insulation resistance to determine whether a leakage current occurs.

According to the present invention, a first line 1 is installed between the cathode terminal A and the anode terminal B of the battery. Also, a second line 2 is diverged from a voltage distribution node n1 on the first line 1. In addition, a third line 3 is installed in parallel with the second line 2.

The terminal selection switching unit comprises a first switch SW1, a second switch SW2 and a third switch SW3. The first switch SW1 and the second switch SW2 are installed on the first line 1. The first switch SW1 is installed between the voltage distribution node n1 and the cathode terminal A of the battery 200, and the second switch SW2 is installed between the voltage distribution node n1 and the anode terminal B of the battery 200. In addition, a first resistor R1 is installed between the first switch SW1 and the cathode terminal A, and a second resistor R2 is installed between the second switch SW2 and the anode terminal B.

The third switch SW3 is installed on the second line 2 extending from the voltage distribution node n1. A third resistor R3 and a fourth resistor R4 are installed between the voltage distribution node n1 and the third switch SW3. A noise-removing capacitor C4 is installed in parallel between the third resistor R3 and the fourth resistor R4.

The floating capacitor C5 is installed on the third line 3. The detection voltage applied from the cathode terminal A or the anode terminal B of the battery 200 is charged to the floating capacitor C5.

The terminal selection switching unit SW1, SW2, SW3 selects a voltage detection path. The voltage detection path comprises a voltage detection path for the cathode terminal A and a voltage detection path for the anode terminal B. The voltage detection path for the cathode terminal A is selected when the first switch SW1 and the third switch SW3 of the terminal selection switching unit turn on. On the contrary, the voltage detection path for the anode terminal B is selected when the second switch SW2 and the third switch SW3 of the terminal selection switching unit turn on.

The charge switching unit comprises a fourth switch SW4 and a fifth switch SW5. The fourth switch SW4 switches the connection between a first terminal $C_{upper}$ of the floating terminal C5 and a voltage detection path for the cathode terminal A or the anode terminal B. Also, the fifth switch SW5 switches the connection between a second terminal $C_{lower}$ of the floating capacitor C5 and the ground. The fourth switch SW4 and the fifth switch SW5 turn on when the detection voltage of the cathode terminal A or the anode terminal B is charged to the floating capacitor C5. In other words, if the fourth switch SW4 and the fifth switch SW5 turn on in the state that the voltage detection path for the cathode terminal A is selected, the detection voltage of the cathode terminal A is charged to the floating capacitor C5. Also, if the fourth switch SW4 and the fifth switch SW5 turn on in the state that the voltage detection path for the anode terminal B is selected, the detection voltage of the anode terminal B is charged to the floating capacitor C5.

The polarity reverse switching unit comprises a sixth switch SW6 and a seventh switch SW7. The sixth switch SW6 switches the connection between the first terminal $C_{upper}$ of the floating capacitor C5 and the ground. Also, the seventh switch SW7 switches the connection between the second terminal $C_{lower}$ of the floating capacitor C5 and the voltage detection path for the cathode terminal A or the anode terminal B. The sixth switch SW6 and the seventh switch SW7 are used for reversing the polarity of detection voltage of the anode terminal B charged to the floating capacitor C5. In other words, if the sixth switch SW6 and the seventh switch SW7 turn on in the state that the charge switching unit SW4, SW5 turns off after the detection voltage of the anode terminal B is charged to the floating capacitor C5, the polarity of detection voltage of the anode terminal B charged to the floating capacitor C5 is reversed.

Meanwhile, in the figure, a positive leakage resistance Rleakage+ and a negative leakage resistance Rleakage− respectively marked at the cathode terminal A and the anode terminal B of the battery 200 indicate a situation when a leakage current occurs, and they represents equivalent virtual resistance values, which appear when a leakage current occurs.

Figure 2:
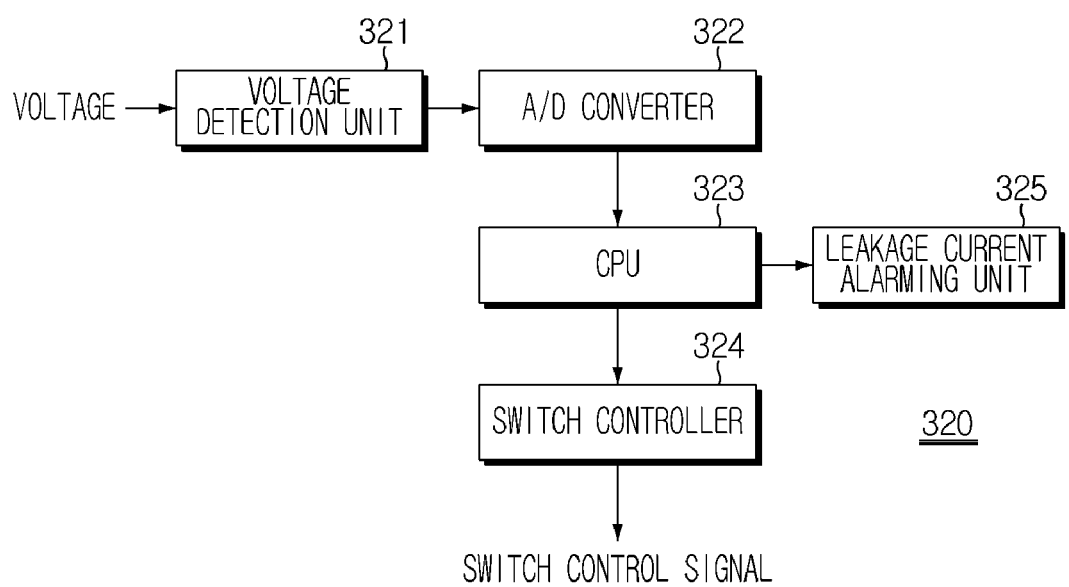
FIG. 2 is a block diagram showing a leakage current determining unit according to a preferred embodiment of the present invention.

FIG. 2 is a block diagram showing the leakage current determining unit 320 according to a preferred embodiment of the present invention.

Referring to FIG. 2, the leakage current determining unit 320 comprises a voltage detection unit 321, an A/D converter 322, a CPU (Central Processing Unit) 323 and a switch controller 324.

The voltage detection unit 321 subsequently senses the detection voltage of the cathode terminal A charged to the floating capacitor C5 and the polarity-reversed detection voltage of the anode terminal B charged to the floating capacitor C5 and then outputs an analog voltage signal. The analog voltage signal comprises a first analog voltage signal corresponding to the detection voltage of the cathode terminal A and a second analog voltage signal corresponding to the polarity-reversed detection voltage of the anode terminal B.

The A/D converter 322 converts the analog voltage signal output from the voltage detection unit 321 into a digital voltage signal. This digital voltage signal comprises a first digital voltage signal corresponding to the detection voltage of the cathode terminal A and a second digital voltage signal corresponding to the polarity-reversed detection voltage of the anode terminal B.

The CPU 323 receives the digital voltage signal from the A/D converter 322 and calculates a leakage resistance. In other words, the CPU 323 classifies the digitalized voltage signal input from the A/D converter 322 into signals for cathode and anode terminals, and then calculates a leakage resistance of the battery 200 according to the following equation 1 by using the voltage signals digitalized for cathode and anode terminals.

$$R_{leakage} = R_i \times \frac{(E - V_A + V_B)}{(V_A - V_B)} \quad \text{Equation 1}$$

Here, $R_i$ is an internal resistance of the leakage current sensing apparatus, E is voltage of both ends of the battery, $V_A$ is a detection voltage of the cathode terminal A charged to the floating capacitor, and $V_B$ is a polarity-reversed detection voltage of the anode terminal B charged to the floating capacitor. In the circuit shown in FIG. 1, if R1=R2, Ri=R1+R3+

R4=R2+R3+R4. The equation 1 is just an example, and it may be changed according to a circuit configuration for measuring a leakage resistance.

Also, the CPU 323 compares the calculated leakage resistance with a preset criterion insulation resistance to determine whether a leakage current occurs. In other words, if the calculated leakage resistance is smaller than the criterion insulation resistance, the CPU 323 determines that a leakage current occurs.

The switch controller 324 controls operations of the terminal selection switching unit SW1, SW2, SW3, the charge switching unit SW4, SW5, and the polarity reverse switching unit SW6, SW7 under the control of the CPU 323.

In other words, the switch controller 324 selectively controls whether or not to turn on the terminal selection switching unit SW1, SW2, SW3, the charge switching unit SW4, SW5, and the polarity reverse switching unit SW6, SW7 such that the detection voltages alternately output from the cathode and anode terminals A, B of the battery 200 may be temporarily stored into the floating capacitor C5 and then the stored detection voltage may be applied to the voltage detection unit 321.

In case a detection voltage of the cathode terminal A is measured, the switch controller 324 turns off the second switch SW2 of the terminal selection switching unit and turns on the first switch SW1 and the third switch SW3 in the state that the polarity reverse switching unit SW6, SW7 turn off. Then, the voltage detection path for the cathode terminal A is selected. In this state, the switch controller 324 turns the charge switching unit SW4, SW5. Then, the detection voltage output from the cathode terminal A is charged to the floating capacitor C5. Here, when the detection voltage of the cathode terminal A is charged, the charging current flows in an I direction. After that, the switch controller 324 turns off the third switch SW3 of the terminal selection switching unit to electrically separate the floating capacitor C5 from the cathode terminal A of the battery. In this state, the voltage detection unit 321 senses the detection voltage charged to the floating capacitor C5, and then outputs an analog voltage signal corresponding to the detection voltage of the cathode terminal A of the battery 200 to the A/D converter 322. Preferably, the voltage detection unit 321 comprises a differential amplifier for sensing a difference of voltage between both terminals of the floating capacitor C5.

Meanwhile, in the case of measuring the polarity-reversed detection voltage of the anode terminal B, the switch controller 324 turns off the first switch SW1 of the terminal selection switching unit and turns on the second switch SW2 and the third switch SW3 in the state that the polarity-reverse switching unit SW6, SW7 turns off. Then, the voltage detection path for the anode terminal B is selected. In this state, the switch controller 324 turns on the charge switching unit SW4, SW5. Then the detection voltage output from the anode terminal B is charged to the floating capacitor C5. Here, when the detection voltage of the anode terminal B is charged, a charging current flows in a II direction. Thus, the detection voltage of the anode terminal B charged to the floating capacitor C5 has a reverse polarity to the detection voltage of the cathode terminal A. Meanwhile, the voltage detection unit 321 has a differential amplifier, and the polarity of the detection voltage of the anode terminal B charged to the floating capacitor C5 is reversed such that the differential amplifier used for sensing the detection voltage of the cathode terminal A may be used as it is. In other words, if the detection voltage of the anode terminal B is charged to the floating capacitor C5, the third switch SW3 of the terminal selection switching unit is turned off to electrically separate the floating capacitor C5 from the anode terminal B of the battery. In this state, the switch controller 324 turns off the charge switching unit SW4, SW5 and turns on the polarity reverse switching unit SW6, SW7. Then, the polarity of the detection voltage of the anode terminal B charged to the floating capacitor C5 is reversed. After that, the voltage detection unit 321 senses the polarity-reversed detection voltage charged to both terminals of the floating capacitor C5 and outputs an analog voltage signal corresponding to the detection voltage of the anode terminal B of the battery 200 to the A/D converter 322. At this time, the voltage detection unit 321 senses a detection voltage with the same polarity as sensing the detection voltage of the cathode terminal A. Thus, the voltage detection unit 321 may comprise only one differential amplifier so as to sense the detection voltages applied from the cathode terminal A and the anode terminal B.

According to the present invention, the leakage current determining unit 320 may audibly or visually output a determination result on the occurrence of a leakage current. For this purpose, the leakage current determining unit 320 may further comprise a leakage current alarming unit 325.

In this case, if the leakage current determining unit 320 determines that a leakage current occurs, the leakage current determining unit 320 may make a visual or audible alarm about the occurrence of a leakage current through the leakage current alarming unit 325. Here, the leakage current alarming unit 325 may be LED, LCD, an alarm device or their combinations. However, the present invention is not limited thereto. Thus many visual or audible alarming devices modified in various ways may be adopted as the leakage current alarming unit 325.

In order to give an alarm about the occurrence of a leakage current, the CPU 323 may compare the calculated leakage resistance with the criterion insulation resistance and then, if the calculated leakage resistance is smaller than the criterion insulation resistance, the CPU 323 may output a leakage current occurrence signal to the leakage current alarming unit 325. Then, the leakage current alarming unit 325 makes a visual or audible alarm about the occurrence of a leakage current according to a predetermined manner. For example, the leakage current alarming unit 325 may blink LED, output an alarm message on LCD, or generates an alarming sound using an alarming device to make an alarm to a user.

The battery leakage current sensing apparatus according to the present invention may be coupled to a battery driving device that receives power from a battery.

As one example, the leakage current sensing apparatus of the present invention may be used in various electronic products receiving a driving voltage from a battery, such as a notebook, a mobile phone and a personal portable multimedia regenerator.

As another example, the leakage current sensing apparatus of the present invention may be coupled to various power-driven devices having a battery loaded therein, such as fossil fuel vehicles, electric vehicles, hybrid vehicles and electric bicycles.

Further, it would be apparent to those having ordinary skill in the art that the leakage current sensing apparatus of the present invention may be modulated into a PCB circuit or an on-demand semiconductor circuit (e.g., ASIC: Application-Specific Integrated Circuit) and then loaded in a battery pack.

FIG. 3 is a flowchart illustrating a method for sensing a leakage current of a battery according to a preferred embodiment of the present invention.

It should be noted that every step explained below is mostly executed by the CPU 323, if there is no special mention, and an operation of each switch is accompanied with the control of the switch controller 324 regulated by the CPU 323.

First, in the step S100, in order to sense a detection voltage output from the cathode terminal A of the battery 200, the first switch SW1 and the third switch SW3 of the terminal selection switching unit and the charge switching unit SW4, SW5 are turned on in a state that the second switch SW2 of the terminal selection switching unit and the polarity reverse switching unit SW6, SW7 turn off. Then, the detection voltage output from the cathode terminal A is charged to the floating capacity C5. In this state, the third switch SW3 of the terminal selection switching unit is turned off to electrically separate the floating capacitor C5 from the cathode terminal A of the battery 200. Then, the detection voltage of the cathode terminal A charged to the floating capacitor C5 is sensed using the voltage detection unit 321. In other words, the voltage detection unit 321 senses the detection voltage of the cathode terminal A and outputs an analog voltage signal to the A/D converter 322. As a response, the A/D converter 322 converts the analog voltage signal into a digitalized voltage signal and inputs the digitalized voltage signal to the CPU 323.

Then, in the step S200, in order to detect a detection voltage output from the anode terminal B of the battery, the second switch SW2 and the third switch SW3 of the terminal selection switching unit and the charge switching unit SW4, SW5 are turned on in a state that the first switch SW1 of the terminal selection switching unit and the polarity reverse switching unit SW6, SW7 turn off. Then, the detection voltage output from the anode terminal B is charged to the floating capacitor C5. In this state, the third switch SW3 of the terminal selection switching unit is turned off to electrically separate the floating capacitor C5 from the anode terminal B of the battery 200. After that, the charge switching unit SW4, SW5 is turned off, and the polarity reverse switching unit SW6, SW7 is turned on to reverse the polarity of the detection voltage of the anode terminal B charged to the floating capacitor C5. In this state, the polarity-reversed detection voltage of the anode terminal B is sensed by the voltage detection unit 321. In other words, the voltage detection unit 321 senses the polarity-reversed detection voltage of the anode terminal B and outputs an analog voltage signal to the A/D converter 322. As a response, the A/D converter 322 converts the analog voltage signal into a digitalized voltage signal and inputs the digitalized voltage signal to the CPU 323.

In the step S300, a leakage resistance is calculated based on the voltage signals of the cathode and anode terminals A, B output in the steps S100 and S200. The method of calculating the leakage resistance is already explained above.

In the step S400, the leakage resistance calculated in the step S300 is compared with a criterion insulation resistance to determine whether the calculated leakage resistance is smaller than the criterion insulation resistance.

The step S500 is executed when the leakage resistance calculated in the step S400 is equal to or greater than the criterion insulation resistance, and it is determined that no leakage current occurs in the battery.

The step S600 is executed when the leakage resistance calculated in the step S400 is smaller than the criterion insulation resistance, and it is determined that a leakage current occurs in the battery.

In the step S700, if it is determined in the step S600 that a leakage current occurs in the battery, an audible or visual alarm is made.

The above steps S100 to S700 may be selectively executed only when sensing a leakage current is needed, or automatically repeatedly executed at regular intervals while a system supplied with power from a battery is in operation.

INDUSTRIAL APPLICABILITY

In one aspect of the present invention, a leakage current of a battery is sensed using a simple leakage current sensing circuit comprising a floating capacitor, so it is possible to sense the occurrence of a leakage current of a battery at an early stage and then prevent the battery from being fully discharged. Also, it is possible to take protective measures against malfunctions or breakdown of internal parts of a vehicle, caused by a leakage current, and also to prevent injury of humans caused by a leakage current of a battery.

In another aspect of the present invention, the floating capacitor is electrically separated from the battery before sensing a voltage charged to the floating capacitor, so it is possible to decrease noise introduced from the battery, which allows more accurate detection of a leakage current.

In still another aspect of the present invention, the polarity of a detection voltage of an anode terminal of the battery, charged to the floating capacitor, is reversed using a polarity reverse switching unit, so a detection voltage with the same polarity is applied to the voltage detection unit. As a result, the circuit configuration of the voltage detection unit may be simplified.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for sensing a leakage current of a battery, comprising:
    a floating capacitor charged with a voltage detected from a cathode terminal or an anode terminal of a battery;
    a terminal selection switching unit for selecting a voltage detection path for the cathode or anode terminal;
    a charge switching unit for charging the floating capacitor with a detection voltage of the cathode or anode terminal, detected through the selected voltage detection path;
    a polarity reverse switching unit for reversing a polarity of the detection voltage of the anode terminal charged to the floating capacitor; and
    a leakage current determining unit for sensing the detection voltage of the cathode terminal charged to the floating capacitor and the polarity-reversed detection voltage of the anode terminal charged to the floating capacitor to calculate a leakage resistance, and then comparing the calculated leakage resistance with a criterion insulation resistance to determine whether or not a leakage current occurs.

2. The apparatus for sensing a leakage current of a battery according to claim 1, further comprising a voltage distribution node installed on a first line formed between the cathode and anode terminals of the battery,
    wherein the terminal selection switching unit comprises:
        a first switch and a second switch respectively installed between the voltage distribution node and the cathode terminal of the battery and between the voltage distribution node and the anode terminal of the battery; and
        a third switch installed on a second line extending from the voltage distribution node.

3. The apparatus for sensing a leakage current of a battery according to claim 2, wherein the floating capacitor is installed on a third line arranged in parallel with the second line.

4. The apparatus for sensing a leakage current of a battery according to claim 2, wherein the charge switching unit comprises: a fourth switch for switching the connection between a first terminal of the floating capacitor and the selected voltage detection path; and a fifth switch for switching the connection between a second terminal of the floating capacitor and the ground.

5. The apparatus for sensing a leakage current of a battery according to claim 4, wherein the polarity reverse switching unit comprises: a sixth switch for switching the connection between a first terminal of the floating capacitor and the ground; and a seventh switch for switching the connection between a second terminal of the floating capacitor and the selected voltage detection path.

6. The apparatus for sensing a leakage current of a battery according to claim 1,
wherein the leakage current determining unit comprises:
a switch controller for controlling operations of the terminal selection switching unit, the charge switching unit and the polarity reverse switching unit;
a voltage detection unit for sensing the detection voltage of the cathode terminal and the polarity-reversed detection voltage of the anode terminal output from the floating capacitor and then outputting an analog voltage signal corresponding thereto;
an A/D (Analog/Digital) converter for converting the output analog voltage signal into a digital voltage signal; and
a CPU (Central Processing Unit) for calculating a leakage resistance using the digital voltage signal received from the A/D converter and then comparing the leakage resistance with the criterion insulation resistance to determine whether or not a leakage current occurs.

7. The apparatus for sensing a leakage current of a battery according to claim 6,
wherein the voltage detection unit comprises a differential amplifier for sensing the detection voltage of the cathode terminal applied from the floating capacitor and the polarity-reversed detection voltage of the anode terminal applied from the floating capacitor.

8. The apparatus for sensing a leakage current of a battery according to claim 1,
wherein the leakage current determining unit calculates a leakage resistance according to the following equation:

$$R_{leakage} = R_i \times \frac{(E - V_A + V_B)}{(V_A - V_B)}$$

where Ri is an internal resistance of the apparatus, E is a voltage of both ends of the battery, VA is the detection voltage of the cathode terminal charged to the floating capacitor, and VB is the polarity-reversed detection voltage of the anode terminal charged to the floating capacitor.

9. The apparatus for sensing a leakage current of a battery according to claim 1,
wherein the leakage current determining unit comprises a leakage current alarming unit for giving a visual or audible alarm when a leakage resistance occurs.

10. The apparatus for sensing a leakage current of a battery according to claim 1,
wherein the leakage current determining unit determines that a leakage current occurs on the condition that the calculated leakage resistance is smaller than a criterion insulation resistance.

11. A battery-driven apparatus comprising the apparatus for sensing a leakage current of a battery according to the claim 1.

12. A battery pack comprising the apparatus for sensing a leakage current of a battery according to the claim 1.

13. A method for sensing a leakage current of a battery comprising:
(a) charging a floating capacitor with a detection voltage of a cathode terminal of a battery by selecting a voltage detection path for the cathode terminal of the battery, and then sensing the charged detection voltage of the cathode terminal;
(b) charging the floating capacitor with a detection voltage of an anode terminal of the battery by selecting a voltage detection path for the anode terminal of the battery, and then reversing a polarity of the charged detection voltage of the anode terminal and sensing the polarity-reversed detection voltage of the anode terminal;
(c) calculating a leakage current by using the sensed detection voltage of the cathode terminal and the polarity-reversed detection voltage of the anode terminal; and
(d) comparing the calculated leakage resistance with a criterion insulation resistance to determine whether or not a leakage current occurs.

14. The method for sensing a leakage current of a battery according to claim 13,
wherein, in the step (c), the leakage current is calculated according to the following equation:

$$R_{leakage} = R_i \times \frac{(E - V_A + V_B)}{(V_A - V_B)}$$

where Ri is an internal resistance of a leakage current sensing apparatus that executes the method, E is a voltage of both ends of the battery, VA is the detection voltage of the cathode terminal charged to the floating capacitor, and VB is the polarity-reversed detection voltage of the anode terminal charged to the floating capacitor.

15. The method for sensing a leakage current of a battery according to claim 13, further comprising:
making a visual or audible alarm when a leakage resistance occurs.

16. The method for sensing a leakage current of a battery according to claim 13,
wherein, in the step (d), it is determined that a leakage current occurs on the condition that the calculated leakage resistance is smaller than a criterion insulation resistance.

* * * * *